US006402840B1

(12) United States Patent
Pandelisev

(10) Patent No.: US 6,402,840 B1
(45) Date of Patent: *Jun. 11, 2002

(54) CRYSTAL GROWTH EMPLOYING EMBEDDED PURIFICATION CHAMBER

(75) Inventor: Kiril A. Pandelisev, Mesa, AZ (US)

(73) Assignee: Optoscint, Inc., Gilbert, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/392,647

(22) Filed: Sep. 9, 1999

Related U.S. Application Data

(60) Provisional application No. 60/147,811, filed on Aug. 10, 1999.

(51) Int. Cl.⁷ .............................................. C30B 35/00
(52) U.S. Cl. ....................................................... 117/223
(58) Field of Search ................................. 117/200, 206, 117/208, 223, 219

(56) References Cited

U.S. PATENT DOCUMENTS

| | | |
|---|---|---|
| 2,498,186 A | 2/1950 | Stockbarger et al. |
| 2,550,173 A | 4/1951 | Swinehart et al. |
| 2,739,088 A | 3/1956 | Pfann |
| 2,902,350 A | 9/1959 | Jenny et al. |
| 2,932,562 A | 4/1960 | Pfann |
| 2,992,903 A | 7/1961 | Imber |
| 3,031,275 A | 4/1962 | Shockley |
| 3,036,898 A | 5/1962 | Brock et al. |
| 3,096,158 A | 7/1963 | Gaulé et al. |
| 3,124,633 A | 3/1964 | Van Run |
| 3,234,009 A | 2/1966 | Siebertz |

(List continued on next page.)

FOREIGN PATENT DOCUMENTS

| | | | | |
|---|---|---|---|---|
| JP | 5795889 A | * | 6/1982 | ............ C30B/11/00 |
| RU | 391836 A | * | 11/1973 | ............ B01D/9/00 |

OTHER PUBLICATIONS

Pastor R.C. et al., "Crystal Growth of KBr in a Reactive Atmosphere", Mat. Res. Bull., vol. 10, pp. 261–266, 1975, Pergamon Press, Inc., U.S.A.

Pastor R.C. et al., "Crystal Growth in a Reactive Atmosphere", Mat. Res. Bull., vol. 10, pp. 117–124, 1975, Pergamon Press, Inc., U.S.A.

*Primary Examiner*—Benjamin L. Utech
*Assistant Examiner*—Matthew A. Anderson
(74) *Attorney, Agent, or Firm*—James Creighton Wray; Meera P. Narasimhan

(57) ABSTRACT

Crystal grower and purification stations immersed within crystal growing furnaces have preparation chambers with circular, elliptical, rectangular or polygonal cross-sections. A lateral heater and a base heater are connected for immersion mounting within the preparation chamber. A porous distributor is mounted above the base heater for immersion within the chamber. An opening or openings in a bottom of the chamber releases crystal material to a crucible or crucibles. A lid mounted on the chamber closes the chamber and forms an enclosed chamber with a closed environment. A crystal material supply, a dopant supply and a reduced pressure exhaust line are connected to the chamber. A purification substance supply is connected to the chamber with fluid purification substances supplied to the porous distributor. An external heater surrounds the chamber for heating the chamber and its contents. Insulation surrounds the external heater. An enclosure surrounds the insulation. A gas source and a vacuum line are connected to the enclosure. The external heater includes plural heaters which extend beyond the chamber. A grower mounted below the chamber and within the enclosure receives the crystal material from the chamber. A crucible in the grower receives the crystal material and holds molten crystal material and a formed crystal. A seed crystal and solid crystal support are mounted within the plural heaters for relatively moving a formed crystal within the plural heaters. A cooler cools the seed.

49 Claims, 5 Drawing Sheets

U.S. PATENT DOCUMENTS

| | | |
|---|---|---|
| 3,249,404 A | 5/1966 | Bennett |
| 3,258,314 A | 6/1966 | Redmond et al. |
| 3,423,189 A | 1/1969 | Pfann |
| 3,453,352 A | 7/1969 | Goundry |
| 3,505,032 A | 4/1970 | Bennett |
| 3,826,817 A | 7/1974 | Pastor et al. |
| 3,884,642 A | 5/1975 | Benedict |
| 3,935,302 A | 1/1976 | Pastor et al. |
| 3,959,442 A | 5/1976 | Pastor et al. |
| 4,036,595 A | 7/1977 | Lorenzini et al. |
| 4,036,666 A | 7/1977 | Mlavsky |
| 4,075,055 A | 2/1978 | Ciszek et al. |
| 4,108,714 A | 8/1978 | Keller et al. |
| 4,110,080 A | 8/1978 | Pastor |
| 4,190,487 A | 2/1980 | Pastor et al. |
| 4,196,041 A | 4/1980 | Baghdadi et al. |
| 4,200,621 A | 4/1980 | Liaw et al. |
| 4,226,834 A | 10/1980 | Shudo et al. |
| 4,242,175 A * | 12/1980 | Zumbrunnen ........... 156/616 R |
| 4,251,315 A | 2/1981 | Pastor |
| 4,273,608 A | 6/1981 | Kerlin |
| 4,277,303 A | 7/1981 | Swinehart |
| 4,312,849 A | 1/1982 | Kramer |
| 4,316,764 A | 2/1982 | Kudo et al. |
| 4,329,195 A | 5/1982 | Kudo |
| 4,330,358 A | 5/1982 | Grabmaier et al. |
| 4,357,200 A | 11/1982 | Grabmaier |
| 4,357,201 A | 11/1982 | Grabmaier et al. |
| 4,417,944 A | 11/1983 | Jewett |
| 4,419,177 A | 12/1983 | Pryor et al. |
| 4,447,289 A | 5/1984 | Geissler et al. |
| 4,449,780 A | 5/1984 | Swinehart |
| 4,454,096 A | 6/1984 | Lorenzini et al. |
| 4,468,281 A | 8/1984 | Bender et al. |
| 4,478,880 A | 10/1984 | Belouet |
| 4,557,795 A | 12/1985 | Helda et al. |
| 4,563,979 A | 1/1986 | Falckenberg et al. |
| 4,599,245 A | 7/1986 | Falckenberg et al. |
| 4,640,023 A * | 2/1987 | Mori et al. ................. 34/57 A |
| 4,688,623 A | 8/1987 | Wakefield et al. |
| 4,690,797 A | 9/1987 | Eyer et al. |
| 4,696,734 A * | 9/1987 | Gentry ....................... 208/407 |
| 4,749,438 A | 6/1988 | Bleil |
| 4,762,687 A | 8/1988 | Béouet et al. |
| 4,775,443 A | 10/1988 | Bleil |
| 4,834,832 A | 5/1989 | Stock et al. |
| 4,873,063 A | 10/1989 | Bleil |
| 4,968,380 A | 11/1990 | Freedman et al. |
| 4,981,528 A | 1/1991 | Fritzemeier et al. |
| 5,047,113 A * | 9/1991 | Ostrogorsky ............. 156/616.1 |
| 5,055,157 A | 10/1991 | Bleil |
| 5,069,742 A | 12/1991 | Bleil |
| 5,069,743 A | 12/1991 | Wysocki et al. |
| 5,116,456 A | 5/1992 | Nestor |
| 5,178,719 A * | 1/1993 | Pandelisev ............... 156/616.4 |
| 5,290,395 A | 3/1994 | Matsumoto et al. |
| 5,296,089 A | 3/1994 | Chen et al. |
| 5,324,488 A | 6/1994 | Klingshirn |
| 5,360,480 A | 11/1994 | Altekrüger |
| 5,454,346 A * | 10/1995 | Uchida et al. ................. 117/13 |
| 5,993,540 A * | 11/1999 | Pandelisev ................... 117/27 |
| 6,153,011 A * | 11/2000 | Pandelisev ................. 117/200 |

\* cited by examiner

CRYSTAL GROWTH EMPLOYING EMBEDDED PURIFICATION CHAMBER

This application claims the benefit of U.S. Provisional Application No. 60/147,811, filed Aug. 10, 1999.

BACKGROUND OF THE INVENTION

Crystals are widely used. They are used from large scintillation crystals to crystal wafers used as substrates in the semiconductor industry, to lenses and mask substrates in the photolitography where purifying, doping and growing crystals continue to require improvements

SUMMARY OF THE INVENTION

The present invention includes self-contained crystal melt purifying and doping process and apparatus that are used in vertical, sloped and horizontal crystal growers to melt and purify starter materials and to release crystal material onto a Bridgeman-Stockbarger vertically moving support or onto a sloped or horizontally moving crystal pallet.

Crystal grower and purification stations have material preparation chambers with circular, elliptical, rectangular or polygonal cross-sections. A lateral heater and a base heater are connected for immersion mounting within the chamber. A porous distributor is mounted above the base heater for immersion within the chamber. An opening in a bottom of the chamber releases molten crystal material. A lid mounted on the chamber closes the chamber and forms an enclosed chamber with a closed environment. A crystal material supply, a dopant supply and a reduced pressure exhaust line are connected to the chamber. A purification fluid supply is connected through the chamber to the porous distributor. An external heater surrounds the chamber for heating the chamber and its contents. Insulation surrounds the external heater. An enclosure surrounds the insulation. A gas source and a vacuum line are connected to the enclosure. The external heater includes plural heaters which extend beyond the chamber. A grower mounted below the chamber and within the enclosure for receives the molten crystal material from the chamber. A crucible receives the crystal material and holds the crystal material and a formed crystal. A seed crystal and solid crystal support are mounted within the plural heaters for relatively moving a formed crystal within the plural heaters.

The invention provides a growing and/or purification crystal station having a lateral heater and a base heater. The base heater and the lateral heater are connected for immersion mounting within a chamber. The station includes a porous distributor mounted above the base heater for immersion within the chamber. The chamber surrounds the lateral heater and the base heater. An opening or openings in a lower part of the chamber releases molten crystal material. The chamber surrounds the porous distributor for mounting all of the elements within the chamber. The chamber, heaters and distributor, the crucibles and supports may be circular, elliptical, rectangular or polygonal in cross-section.

A lid is mounted on the chamber for closing the chamber and forming an enclosed chamber with a closed environment. A crystal material supply, a dopant supply and a reduced pressure exhaust line are connected to the chamber. A purification substance supply is connected to the chamber and supplies fluid purification substance to the porous distributor. An external heater surrounds the chamber for heating the chamber and its contents. Insulation surrounds the external heater, and an enclosure surrounds the insulation.

An inert gas source and a vacuum line are connected to the enclosure. Preferably the external heater includes plural heaters, and the plural heaters extend beyond the chamber.

A seed crystal and molten and solid crystal crucible is support mounted within the plural heaters for relatively moving within the plural heaters in a crystal grower. The plate grower is mounted below the chamber and within the enclosure for receiving the molten crystal material from the chamber. The plate grower includes a crucible for receiving the molten crystal material and holding the molten crystal material and a formed crystal. In one embodiment, the crucible comprises dividers for forming plural formed crystals. In other embodiments plural crucibles are stacked or arranged side by side. A formed crystal mover mounted adjacent an end of the crucible for drawing the formed crystal, or moving the crucible.

Plural external heaters extend around the chamber, the crucible and the crystal mover.

Crucible heaters extend near the crucible for heating the molten crystal material and the formed crystal therein. In one form, the crucible heaters comprise plural crucible surround heaters for surrounding the crucible. Preferably at least one of the plural heaters includes a dopant controller.

Other plural crucible heaters include plural proximity surface heaters. Preferably a dopant controller extends into molten crystal material between the proximity surface heaters.

The preferred material preparation chamber comprises a fully contained purification and refill chamber. A purification substance supply is connected to the chamber. A purification fluid source is connected to the porous distributor in the chamber, and a reduced pressure exhaust connected to the chamber. A crystal starter material source is connected to the chamber.

In one embodiment, plural crucibles are positioned within the enclosure and are stacked atop each other below the chamber for receiving molten crystal material.

In one embodiment, plural crucibles are positioned side by side beneath the chamber within the enclosure for concurrently growing plural crystals.

These and further and other objects and features of the invention are apparent in the disclosure, which includes the above and ongoing written specification, with the claims and the drawings.

BRIEF DESCRIPTION OF THE DRAWINGS

FIGS. 10a, 10a1, 10a2, 10a3, 10a6, 10b1, 10b2, 10b3, 10b4, 10c, 10c1, 10c2, 10c3, 10c4, 10d show various types of crucibles for growing crystals with plate or bar shapes.

DETAILED DESCRIPTION OF THE PREFERRED EMBODIMENTS

Figure 1:
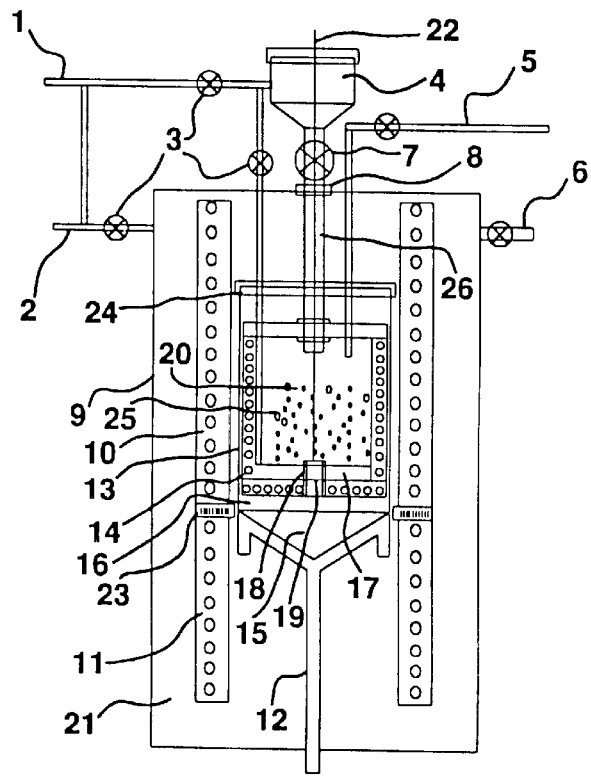
FIG. 1 shows a crystal grower with purifying and doping provisions.
Figure 2:
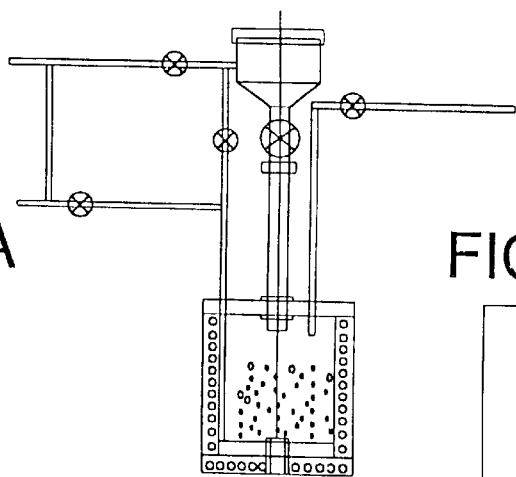
FIG. 2 shows a detail of the embedded purification/refill unit.

A Bridgeman-Stockbarger process employing a new crucible embedded purification chamber is described with reference to FIGS. 1 and 2. In situ purification of the crystalline material using gaseous, liquid, and solid reactive materials as well as means for transfer of the purified material to the crucible are the essence of this invention. The system has one or more than one melt transfer openings placed on the bottom or the sides of the purification chamber. Only one opening is shown here. The process that takes place is as follows.

Crystalline material 25 is placed in the embedded purification chamber 14 using the refill funnel 4 placed above the refill channel flow valve 7 using the inlet tube 26. After the procedure of vacuuming and purging of the crystal growth chamber 9 and the crucible embedded purification chamber with inert gases such as argon, nitrogen, helium or other gases introduced via the inlet tube 2, the crystalline material is treated with reactive gases introduced via the inlet 1. Valves 3 are used to control the flow of all gaseous substances used for the purging and purification processes. Liquid and/or solid reactive substances are introduced via the same path the crystalline powder is introduced.

The purification takes place at various temperatures while the material is in solid or liquid form, depending on the properties of the start-up material and the purification results desired. When certain purification has been achieved, the material is transferred into a crucible 13 all at once or in a continuous fashion using one or more melt flow openings such as the one 18 having a plug 19 as shown in FIG. 2. During the purification process either the crucible is in the upper heating zone 10 or at any other position if both zones have the same temperature setting.

After proper positioning of the crucible and establishing proper temperatures at the upper and lower heat zones, and the desired temperature gradient at the baffle area 23, crystal 15 is initiated at the bottom of the crucible. The height of the crystal melt depends on the position of the bottom of the purification/refill chamber and whether the refill is continuous (by controlling the flow via the openings such as 18, their position or whether the flow is based on the hydrostatic pressure equivalency principle. Alternatively, the melt transfer is conducted in incremental batches.

The heater at the bottom of the purification chamber serves as a heating element for the purification/refill chamber as well as a heat sink or heat source for control for the melt/solid interface. Both the crucible and the purification/refill chamber can move with respect to each other and the upper and bottom heater.

The dopant can be introduced either using the refill funnel 4 placed above the refill channel flow valve 7 and the inlet tube 26. Alternatively, dopant may be introduced to the refill purification/refill chamber or directly to the molten crystalline material 16. Crystals having preferential dopant profile can be grown using this approach. Crystals having any desired length can be grown using this method. The crucible can have cylindrical or any other shape. Cylindrical (rectangular or not) as well as other shaped crystals in forms of rods, plates, or any other desired geometry can be grown using this method.

Figure 2A:
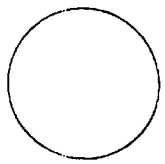
FIGS. 2A, 2B, and 2C are bottom views, which show shapes of the base of the unit shown in FIG. 2.
Figure 2B:
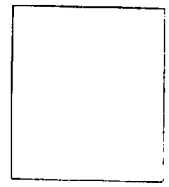
Figure 2C:
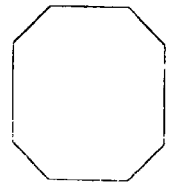

FIGS. 2A–2C show different geometries for the base of the purification preparation, or refill chamber used in cylindrical growth as well as any other crystal shape.

FIGS. 3–10 show a continuous and semi-continuous crystal growth employing a preparation, purification or refill chamber.

Figure 3:
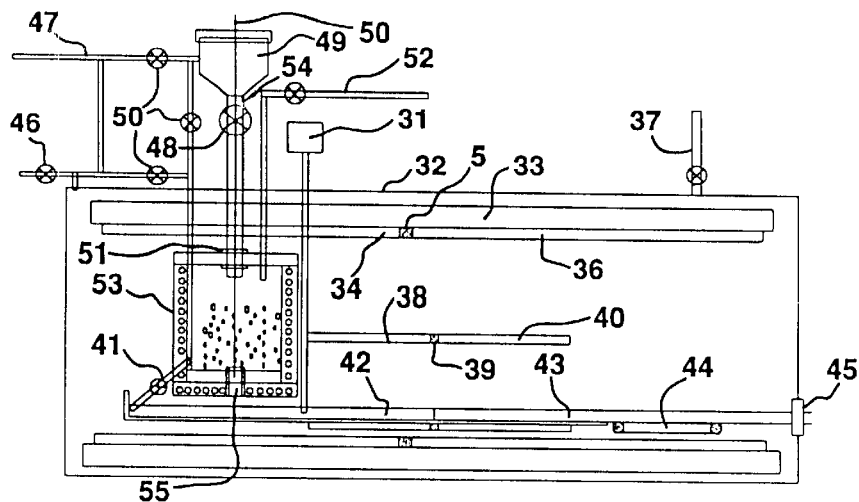
FIG. 3 schematically shows crystal plate growth using a purification and refill chamber.

FIG. 3 describes a crystal growth apparatus and process for producing crystalline bodies having shapes of plates, bars, or any other geometry for that matter.

The crystalline material is introduced via the refill funnel 49 and inlet tube 54 The flow is controlled with the valve 48. After the crystalline material is heated to the appropriate temperature employing the purification/refill chamber heating elements and/or the chamber heaters, heater 1, 34 and heater 2, 36, the material is vacuumed using vacuum line 52 and purged with gases using inlet 46. Purification is carried out by introducing reactive gases through inlet 47 that is controlled by valves 50. The purification takes place while the starting material is in solid or molten form. The reactive and reacted gases are removed through reduced pressure to outlet 52. When the material is prepared, it is transferred to the crucible using distributor 41 or one or more melt opening 55. The molten material is doped using dopant distributor 31 (if dopant is needed) and enters into the embedded heater package consisting of two (heater 38 and 40 here) or more heating elements. Temperature gradient is formed in this inserted heat zone assembly: on one end is molten crystalline material 42 and on the other a solid crystal 43. The crystal is withdrawn using the motion mechanism assembly 44. The crystal exit assembly 45 provides for preserving of the proper environment in the chamber.

Figure 10:
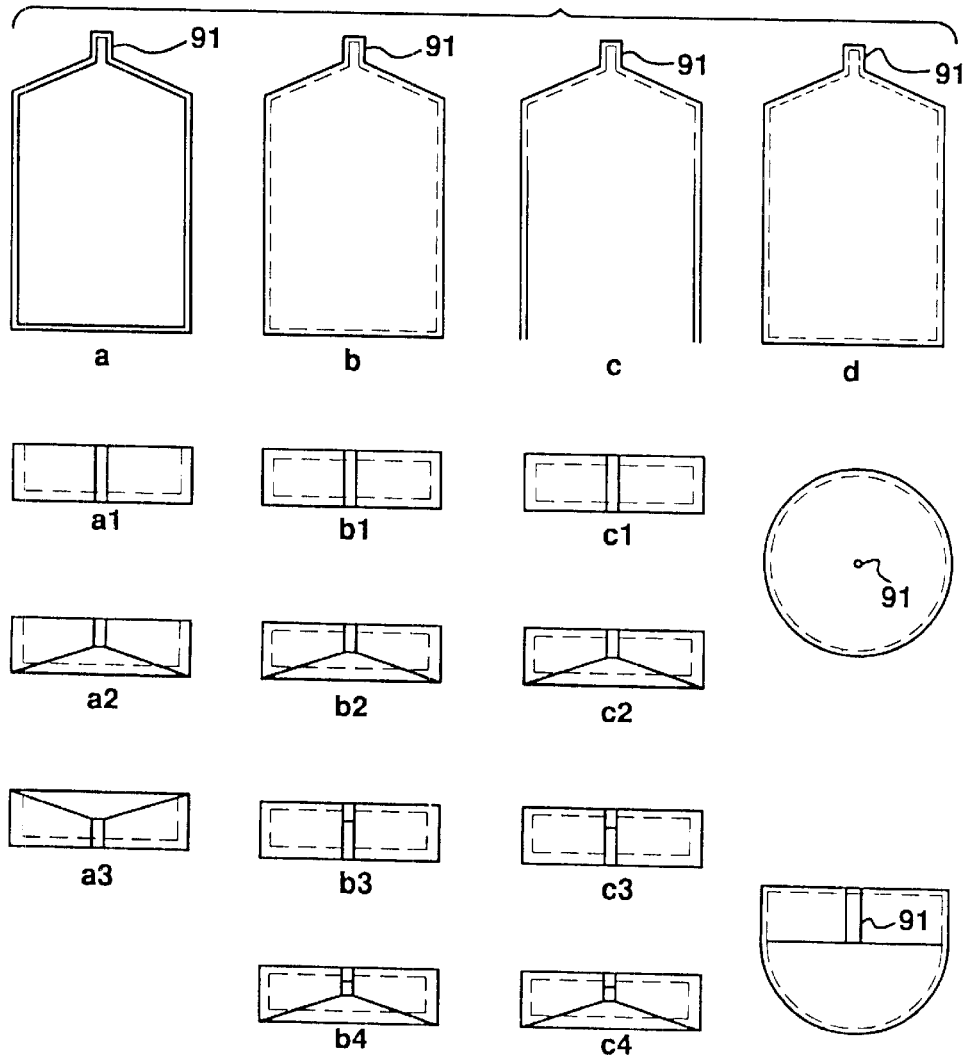

The crucible and the crystal plane containing the molten and solid crystal are positioned under the appropriate angle to facilitate material supply to the melt/solid interface. The crucible can have a finite or open volume. The shape of the cross section can be rectangular, elliptical, circular, or any other desired shape for the crystal being grown. Some of the crucible shapes are as shown in FIG. 10.

Figure 4:
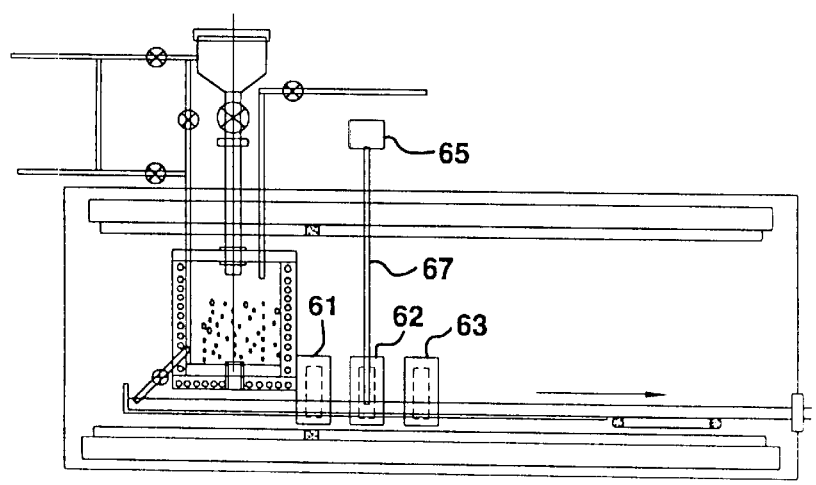
FIG. 4 shows the apparatus of FIG. 3 with additional crystal surrounding zone heaters.

FIG. 4 shows the crystal grower of FIG. 3 employing proximity surround heaters (61–63 shown here) before and after the melt-solid interface. A very defined temperature gradient of any desired magnitude can be achieved by this type of heater shape and arrangement. Besides the heating elements, a minimum of two and preferably more than two heaters will be employed. The heaters can incorporate gas modules that extend the doping and/or purification process to the surface of the crystal melt, will add the capability for formation of ternary and quaternary compounds for certain applications, or will allow for doping of some of the crystals, if doping is needed. A separate dopant controller, 65 and 67, is also shown, if needed. Dopant is controlled by adding dopant or removing dopant with or without other impurities by releasing purification gas with controller 65, 67.

Figure 5:
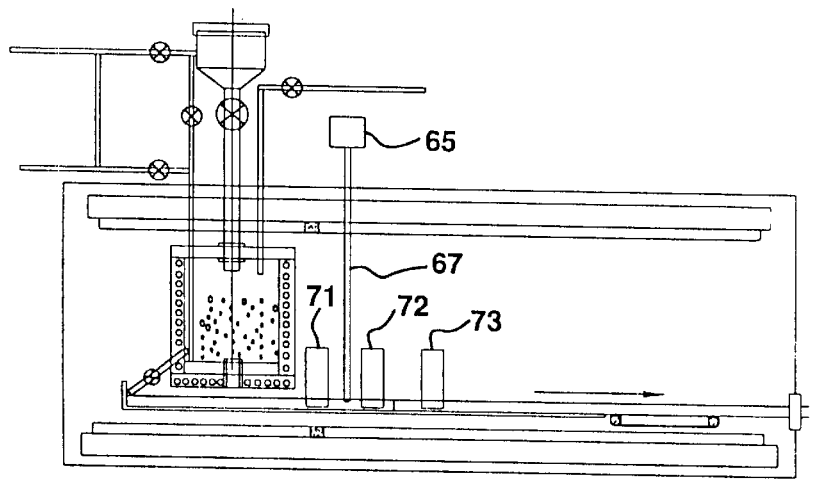
FIG. 5 shows the apparatus of FIG. 3 with additional crystal surrounding immersed heaters.

FIG. 5 shows the crystal grower of FIG. 3 employing immersed heaters 71–73 before and after the melt-solid interface. A very defined temperature gradient of any desired magnitude can be achieved by this type of heater shape and arrangement. A minimum of two and preferably more than two heaters will be employed. Besides the heating elements, the heaters can incorporate gas modules that extend the purification process to the crystal melt, will add the capability for formation of ternary and quaternary compounds for certain applications, or will allow for doping of some of the crystals, if doping is needed. The separate dopant distributor supply, G5 and G7, is also shown, if needed.

Figure 6:
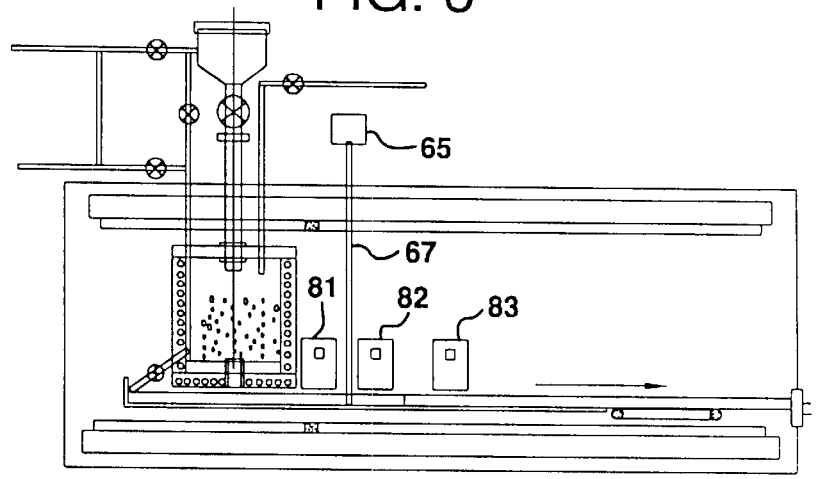
FIG. 6 shows the apparatus of FIG. 3 with additional crystal surrounding proximity surface heaters.

FIG. 6 shows the crystal grower of FIG. 3 employing proximity surface heaters 81–83 before and after the melt-solid interface. A very defined temperature gradient of any desired magnitude can be achieved by this type of heater shape and arrangement. A minimum of two and preferably more than two heaters will be employed. The heaters, besides the heating elements, can incorporate gas modules that will extend the purification process to the crystal melt, will add the capability for formation of ternary and quaternary compounds for certain applications, or will allow for doping of some of the crystals, if doping is needed. A separate dopant supply distributor, 65 and 67, is also shown, if needed.

Figure 7:
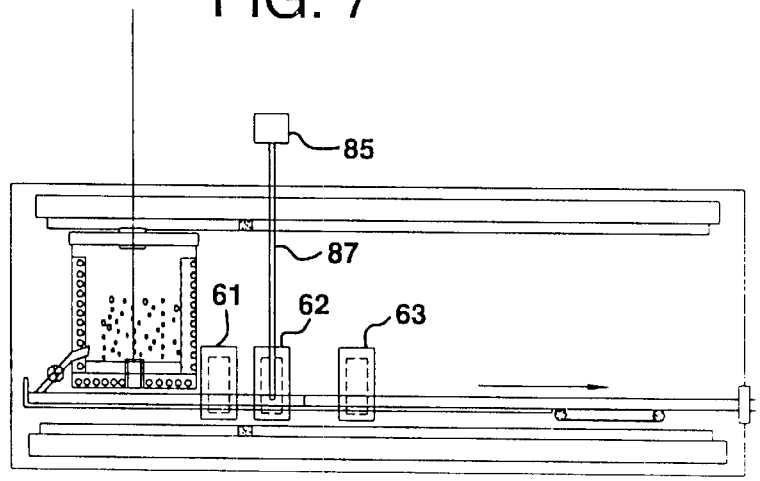
FIG. 7 shows the apparatus of FIG. 3 with additional purification and refill stations and surrounding heaters.

FIG. 7 shows a crystal grower employing proximity surround heaters, 61–63, with fully contained purification/refill station, 85–87. This approach is intended for crystals having finite size and shape.

Figure 8:
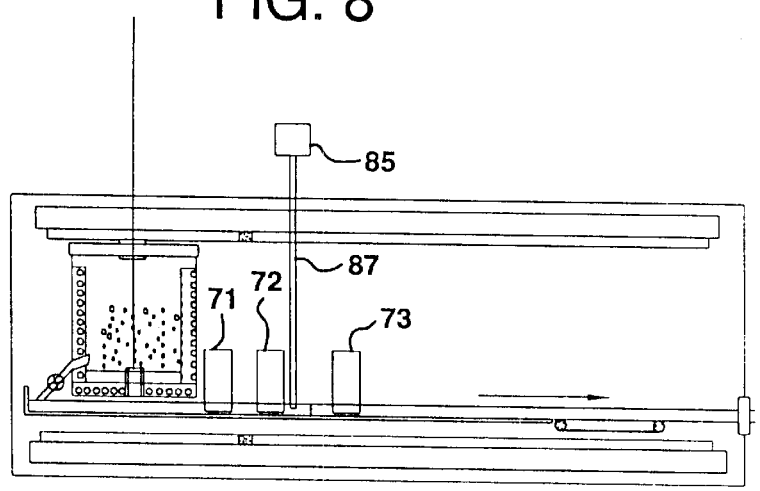
FIG. 8 shows the apparatus of FIG. 3 with additional purification and refill stations and immersed heaters.

FIG. 8 shows a crystal grower employing immersed heaters, 71–73, with fully contained purification/refill station, 85–87. This approach is intended for crystals having finite size and shape.

Figure 9:
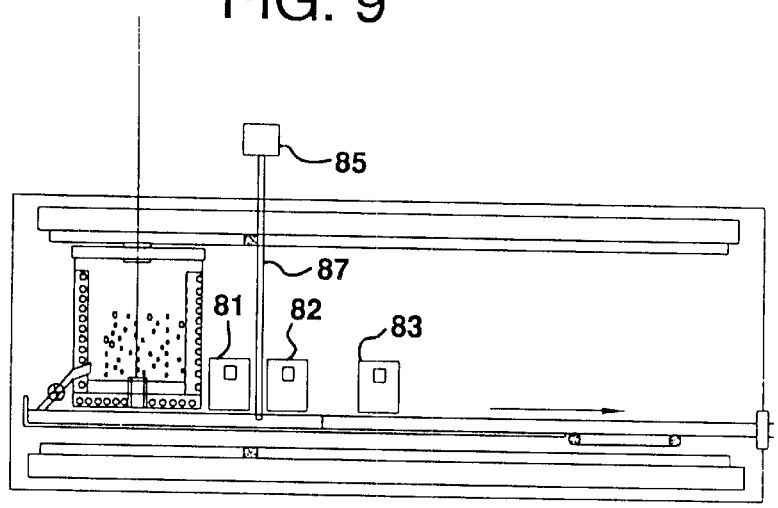
FIG. 9 shows the apparatus of FIG. 3 with proximity surface heaters with a fully contained purification and refill station.

FIG. 9 shows a crystal grower employing proximity surface heaters with fully contained purification/refill station, 85–87. This approach is intended for crystals having finite size and shape.

FIG. 10 shows crucible shapes which may be horizontal or angled to facilitate crystal growth. A growing crystal in an open-topped crucible is represented in a. Seed is placed in the small end, 91. Variations of the seed-holding end are shown in a1, a2, and a3. The seed is held near the top in a2 and near the bottom in a3.

A closed crucible is shown in b. Seed is held across the end in bi, near the top in b2, in the middle of the end in b3, and in a small position spaced from the top in b4.

A closed-top and open-ended crystal-growing crucible is shown in c. Seed is held across the end, near the top, in the middle, and in a small holder slightly spaced from the top as shown in c1, c2, c3 and c4, respectively.

A cylindrical or semi-cylindrical crucible is shown in d. In one end view, the crucible is open and the seed holder is centered in an end. In the lower end view, the upper portion of the crucible is rectangular, and the lower portion is semi-cylindrical. The seed is mounted in a holder that extends along one end of the rectangular portion.

Figure 11:
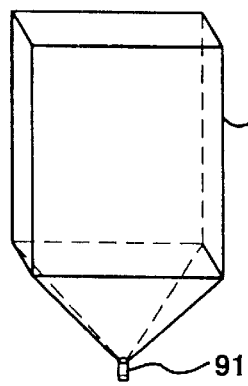
FIG. 11 shows a rectangular crucible for growing a rectangular crystal.

A rectangular crucible 101 is shown in FIG. 11 as a representation of crucibles having rectangular, circular, elliptical, polygonal or other regular or irregular cross-sections. A seed holder 91 is shown at one end of the crucible 101.

Figure 12:
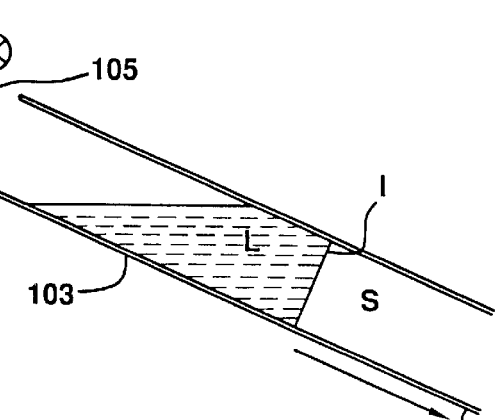
FIG. 12 schematically shows sloped crystal growth configuration.

A sloped configuration 103 is shown in FIG. 12. Valved filler tube 105 leads from the crystal material preparation station. The crystal material liquifies or remains liquid L until the interface I, where the formed crystal solidifies and becomes solid S. The solid crystal continues down the slope 107.

Figure 13:
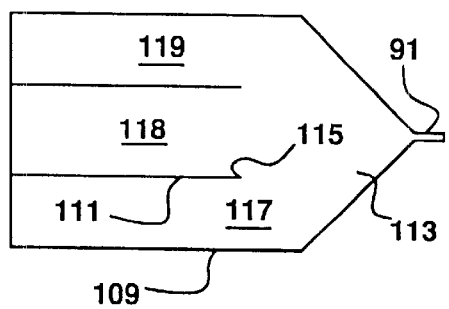
FIG. 13 schematically shows side by side crystal growth crucibles and movers.

FIG. 13 shows a crucible 109 with an example of dividers 111 which are interposed between sections of the crucible. The seed holder 91 starts crystal growth. An interface proceeds through section 113 to the ends 115 of the dividers 111, whereupon three separate interfaces are formed in the channels 117, 118 and 119.

The dividers 111 are usually made of the same material as the crucible.

Figure 14:
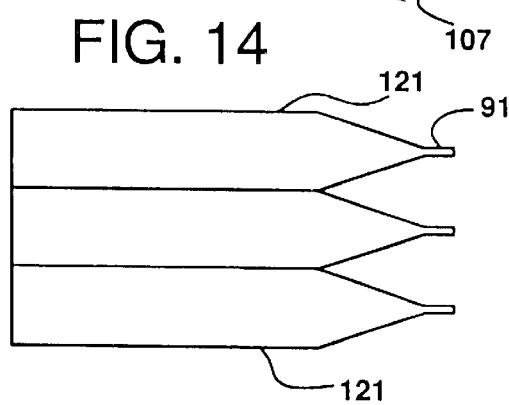
FIG. 14 shows stacked crucibles.

FIG. 14 shows an example of three parallel crucibles 121, each with seed holders 91. The crucibles 121 are mounted in a single enclosure and receive crystal material from a single preparation station.

Figure 15:
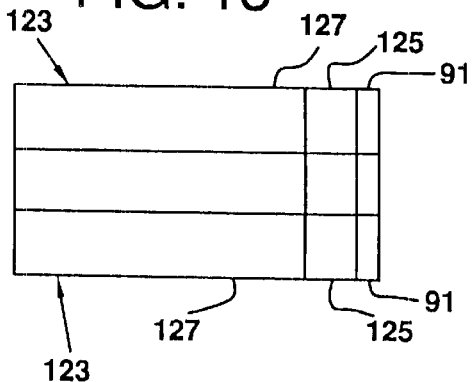
FIG. 15 shows dividers in a crucible.

FIG. 15 shows an example of three stacked crucibles 123. The seed holders 91 lead to cones 125, which lead to the bodies 127, which in this example are rectangular.

Figure 16:
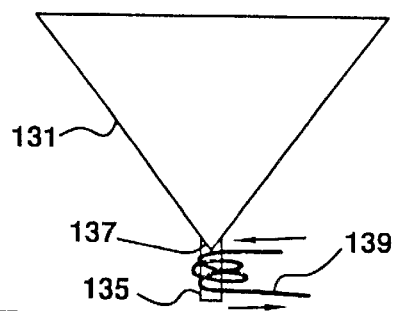
FIG. 16 schematically shows seed cooling.
Figure 17:
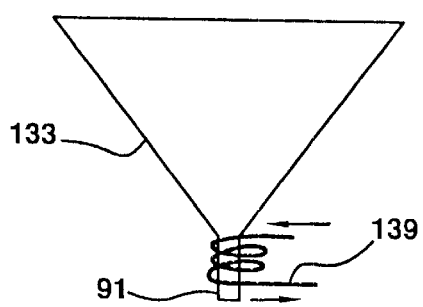
FIG. 17 schematically shows seed forming and cooling.

FIGS. 16 and 17 show two crucibles 131 and 133. The former has a stub 135 which surrounds and cools the tip 137, where a single seed is self-formed. Crucible 133 has a seed holder 91. Both seed holder 91 and stub 135 are cooled with a cooling coil 139 to start the crystal growth.

While the invention has been described with reference to specific embodiments, modifications and variations of the invention may be constructed without departing from the scope of the invention, which is defined in the following claims.

I claim:

1. Crystal apparatus comprising a preparation station having a lateral heater and a base heater, the base heater and the lateral heaters connected for immersion mounting within a material preparation chamber.

2. The apparatus of claim 1, further comprising a porous distributor mounted above the base heater for immersion within the chamber.

3. The apparatus of claim 1, further comprising a chamber surrounding the lateral heater and the base heater and an opening in a lower part of the chamber for releasing crystal material.

4. The apparatus of claim 3, wherein the chamber surrounds the porous distributor for mounting all of the elements within the chamber.

5. The apparatus of claim 4, wherein the chamber is circular, elliptical, rectangular or polygonal in cross-section.

6. The apparatus of claim 4, wherein the chamber further comprises a lid for mounting on the chamber for closing the chamber and forming an enclosed chamber with a closed environment.

7. The apparatus of claim 6, further comprising a crystal material supply, a dopant supply and a reduced pressure exhaust line connected to the chamber, and a purification substance supply connected to the chamber and supplying fluid purification substance to the porous distributor.

8. The apparatus of claim 7, further comprising an external heater surrounding the chamber for heating the chamber and its contents.

9. The apparatus of claim 8, further comprising insulation surrounding the external heater and an enclosure surrounding the insulation.

10. The apparatus of claim 9, further comprising an inert gas source and a vacuum line connected to the enclosure.

11. The apparatus of claim 10, wherein the external heater comprises plural heaters, and wherein the plural heaters extend beyond the chamber.

12. The apparatus of claim 11, further comprising a crucible support mounted within the plural heaters for relatively moving a resulting formed crystal within the plural heaters in a crystal grower.

13. The apparatus of claim 10, further comprising a grower mounted below the chamber and within the enclosure for receiving the crystal material from the chamber.

14. The apparatus of claim 13, wherein the grower further comprises a crucible for receiving the molten crystal material and holding the crystal material and a formed crystal.

15. The apparatus of claim 14, wherein the crucible comprises dividers for forming plural formed crystals.

16. The apparatus of claim 14, further comprising a crystal mover mounted adjacent an end of the crucible for moving the formed crystal, or moving the crucible.

17. The apparatus of claim 16, wherein the plural external heaters extend around the chamber, the crucible and the crystal mover.

18. The apparatus of claim 17, further comprising crucible heaters extending near the crucible for heating the molten crystal material and the formed crystal therein.

19. The apparatus of claim 18, wherein the crucible heaters comprise plural crucible surround heaters for surrounding the crucible.

20. The apparatus of claim 19, wherein at least one of the plural heaters includes a dopant controller.

21. The apparatus of claim 19, further comprising plural crucibles positioned within the enclosure and stacked atop each other below the preparation, purification or refill chamber for receiving crystal material.

22. The apparatus of claim 18, wherein the plural crucible heaters comprise plural proximity surface heaters or immersed heaters.

23. The apparatus of claim 22, further comprising a dopant controller extending into molten crystal material between the proximity surface heaters.

24. The apparatus of claim 18, wherein the preparation chamber comprises a fully contained purification and refill chamber.

25. The apparatus of claim 18, further comprising a crystal starter material source connected to the chamber.

26. The apparatus of claim 18, further comprising a purification gas, liquid or solid supply connected to the chamber, with a purification fluid source connected to the porous distributor in the chamber and a reduced pressure exhaust connected to the chamber.

27. The apparatus of claim 14, further comprising plural crucibles positioned side by side beneath the chamber within the enclosure for growing plural crystals.

28. Crystal grower apparatus comprising a material preparation station having a material preparation chamber having a circular, elliptical, rectangular or polygonal in cross-section, a lateral heater and a base heater, the base heater and the lateral heaters connected for immersion mounting within the chamber, a porous distributor mounted above the base heater for immersion within the chamber, an opening or openings in a lower part of the chamber for releasing crystal material, a lid mounted on the chamber for closing the chamber and forming an enclosed chamber with a closed environment, a crystal material supply, a dopant supply and a reduced pressure exhaust line connected to the chamber, and a purification substance supply connected to the chamber for supplying purification substance to the chamber and supplying fluid purification substance to the porous distributor, an external heater surrounding the chamber for heating the chamber and its contents, insulation surrounding the external heater, an enclosure surrounding the insulation, an inert gas source and a vacuum line connected to the enclosure, wherein the external heater comprises plural heaters, and wherein the plural heaters extend beyond the chamber, further comprising a grower mounted below the chamber and within the enclosure for receiving the crystal material from the chamber, wherein the grower further comprises a crucible for receiving the crystal material and holding molten crystal material and a formed crystal, further comprising a support mounted within the plural heaters for relatively moving a formed crystal within the plural heaters.

29. Crystal apparatus comprising a crystal material preparation station having an embedded material preparation chamber embedded in a furnace.

30. The apparatus of claim 29, further comprising a heater connected for immersion mounting within the material preparation chamber.

31. The apparatus of claim 29, further comprising a porous distributor mounted for immersion within the chamber.

32. The apparatus of claim 31, further comprising a crystal material supply, a dopant supply and a reduced pressure exhaust line connected to the chamber, and a purification substance supply connected to the chamber and supplying fluid purification substance to the porous distributor.

33. The apparatus of claim 29, further comprising an opening or openings in a lower part of the chamber for releasing crystal material.

34. The apparatus of claim 29, wherein the chamber further comprises a lid for mounting on the chamber for closing the chamber and forming an enclosed chamber with a closed environment.

35. The apparatus of claim 29, further comprising an external heater outside of the chamber and inside the furnace for heating the chamber and its contents.

36. The apparatus of claim 35, further comprising insulation surrounding the external heater and an enclosure surrounding the insulation.

37. The apparatus of claim 36, further comprising a gas source and a vacuum line connected to the enclosure.

38. The apparatus of claim 36, wherein the external heater comprises plural heaters, and wherein the plural heaters extend beyond the chamber.

39. The apparatus of claim 38, further comprising a support mounted within the plural heaters for relatively moving a resulting formed crystal within the plural heaters in a crystal grower.

40. The apparatus of claim 39, further comprising a grower mounted below the chamber and within the enclosure for receiving the crystal material from the chamber.

41. The apparatus of claim 40, wherein the grower further comprises a crucible for receiving the crystal material and holding molten crystal material and a formed crystal.

42. The apparatus of claim 29, further comprising a crystal material supply outside of the furnace, and a valved refill inlet tube connected to the material supply and to the embedded material preparation chamber.

43. Crystal apparatus comprising a Bridgeman-type crystal grower having a crucible, a preparation station having a heater connected for immersion mounting within the crucible near a melt-solid interface, and a porous distributor mounted above the heater for immersion within the crucible.

44. The apparatus of claim 43, further comprising a crystal material supply, a dopant supply and a reduced pressure exhaust line connected to the crucible, and a purification substance supply connected to the crucible for supplying purification substance to the crucible, including supplying fluid purification substance to the porous distributor.

45. Crystal apparatus comprising a crucible, plural crucible heaters extending near the crucible for heating molten crystal material and formed crystal therein, and a dopant controller extending to or into the molten crystal material near the plural crucible heaters for controlling purity and dopant level in the molten crystal material.

46. The apparatus of claim 45, wherein the plural crucible heaters comprise plural crucible surround heaters for surrounding the crucible.

47. The apparatus of claim 46, wherein the dopant controller is connected to at least one of the plural crucible heaters.

48. The apparatus of claim 45, wherein the plural crucible heaters comprise plural proximity surface heaters or plural immersed heaters.

49. Means for a crystal growth process, comprising means for providing a material preparation station having a material preparation chamber, a lateral heater and a base heater, and means for immersion mounting the base heater and the lateral heaters within the material preparation chamber.

\* \* \* \* \*